(12) United States Patent
Ji

(10) Patent No.: US 11,733,314 B2
(45) Date of Patent: Aug. 22, 2023

(54) MONITORING APPARATUS AND SYSTEM FOR AN IONIZER

(71) Applicant: SK hynix Inc., Gyeonggi-do (KR)

(72) Inventor: Moon Young Ji, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 206 days.

(21) Appl. No.: 17/149,409

(22) Filed: Jan. 14, 2021

(65) Prior Publication Data
US 2021/0263110 A1 Aug. 26, 2021

(30) Foreign Application Priority Data
Feb. 21, 2020 (KR) .................. 10-2020-0021741

(51) Int. Cl.
*G01R 31/56* (2020.01)
*H05F 3/04* (2006.01)
*G08B 7/06* (2006.01)
*H04Q 9/00* (2006.01)

(52) U.S. Cl.
CPC ............ *G01R 31/56* (2020.01); *G08B 7/06* (2013.01); *H04Q 9/00* (2013.01); *H05F 3/04* (2013.01)

(58) Field of Classification Search
CPC .. G01R 31/56; G08B 7/06; H04Q 9/00; H05F 3/04
See application file for complete search history.

(56) References Cited

U.S. PATENT DOCUMENTS

| | | | | |
|---|---|---|---|---|
| 6,252,233 B1* | 6/2001 | Good | ................. | H05F 3/04 361/213 |
| 7,586,731 B2* | 9/2009 | Sato | ................. | H01T 19/04 361/231 |
| 2003/0165040 A1* | 9/2003 | Posadas | ................. | H05F 3/04 361/213 |
| 2009/0135537 A1* | 5/2009 | Yasuoka | ................. | H01T 23/00 361/213 |
| 2013/0105700 A1* | 5/2013 | Fukada | ................. | G01R 19/0061 250/389 |
| 2017/0079125 A1* | 3/2017 | Oldynski | ................. | H01T 19/00 |

FOREIGN PATENT DOCUMENTS

| | | | | |
|---|---|---|---|---|
| EP | 3260872 | * | 12/2017 | ........... G01R 19/165 |
| JP | 2005199153 | * | 7/2005 | ............ B08B 5/00 |
| KR | 10-1329152 | | 11/2013 | |
| KR | 101329152 | * | 11/2013 | ............ H01T 19/00 |
| KR | 101629915 B1 | | 6/2016 | |

(Continued)

OTHER PUBLICATIONS

Office Action of Korea Intellectual Property Office (KIPO) dated Sep. 25, 2021.

*Primary Examiner* — Alexander Satanovsky
*Assistant Examiner* — Sharah Zaab
(74) *Attorney, Agent, or Firm* — IP & T Group LLP

(57) ABSTRACT

A monitoring apparatus may include a charge plate, a detection sensor, a voltage generator and a controller. The detection sensor may be arranged adjacent to the charge plate to detect a voltage of the charge plate. The voltage generator may be configured to selectively apply a voltage to the charge plate. The controller may be configured to receive and store voltage values and their transmission time transmitted from the detection sensor in generating ions from the ionizer during a monitoring time. The controller may be configured to check a discharge performance of the ionizer based on the voltage values and their respective transmission times.

17 Claims, 10 Drawing Sheets

(56) References Cited

FOREIGN PATENT DOCUMENTS

| KR | 10-1838897 | | 3/2018 | |
|---|---|---|---|---|
| KR | 10-2019-0035644 A | | 4/2019 | |
| KR | 20190034798 | * | 4/2019 | ............. G01R 29/12 |

* cited by examiner

MONITORING APPARATUS AND SYSTEM FOR AN IONIZER

CROSS-REFERENCES TO RELATED APPLICATION

The present application claims priority under 35 U.S.C. § 119(a) to Korean application number 10-2020-0021741, filed on Feb. 21, 2020, in the Korean Intellectual Property Office, which is incorporated herein by reference in its entirety.

BACKGROUND

1. Technical Field

Various embodiments may generally relate to a monitoring apparatus and a system for an ionizer.

2. Related Art

A static electricity and charged particles generated from various equipments such as semiconductor fabrication equipment may cause bad product quality and fires. In order to solve the above-mentioned problems, various discharge apparatuses may be applied to the equipments.

The discharge apparatus may include an ionizer. The ionizer may apply a cation or an anion obtained by discharging a high voltage to the object to neutralize a polarity of the object opposite to the static electricity, thereby removing the static electricity.

Thus, the removal of the static electricity generated in a process may be an important factor of the object quality. Thus, it may be required to maintain a performance of the ionizer in good state.

Recently, an apparatus for measuring the performance of the ionizer may have a large size. Thus, the apparatus may not be installed in the equipment. A user may directly hold the apparatus to apply the high voltage to a plate, thereby measuring a decay time.

SUMMARY

Example embodiments may provide a monitoring apparatus that may be capable of automatically monitoring a performance of an ionizer.

Example embodiments may also provide a monitoring system including the above-mentioned monitoring apparatus.

In example embodiments of the present disclosure, a monitoring apparatus of an ionizer may include a charge plate arranged in an equipment with at least one ionizer, the charge plate formed to correspond to the ionizer; a detection sensor arranged adjacent to the charge plate to detect a voltage of the charge plate; a voltage generator configured to apply the voltage to the charge plate; and a controller configured to control the voltage applied to the charge plate through the voltage generator, to receive and store voltage values and their transmission time which are transmitted from the detection sensor in generating ions from the ionizer during a monitoring time, and to check a discharge performance of the ionizer based on the voltage values and their respective transmission times, wherein the charge plate and the detection sensor are formed to correspond to the at least one ionizer.

In example embodiments of the present disclosure, a monitoring system may include a monitoring apparatus positioned in an equipment including at least one ionizer to detect a time until a voltage value is decreased to a reference voltage based on voltage values detected during monitoring the equipment, thereby checking a discharge performance of the ionizer; an integration link apparatus configured to convert a type of the discharge performance and a communication protocol of the ionizer transmitted from the monitoring apparatus into a reference type and a reference communication protocol; and a management server configured to compare the discharge performance of the ionizer transmitted from the integration link apparatus with a reference value to store analysis information including abnormal state of the ionizer and to control operations of the ionizer in accordance with the analysis information.

In example embodiments of the present disclosure, a monitoring apparatus of an ionizer may include a voltage generator configured to apply first voltages to a charge plate; a detection sensor configured to detect second voltages of the charge plate; a controller configured to control the first voltages, to receive the detected second voltages from the detection sensor, and to determine a discharge performance of the ionizer based on the detected second voltages.

According to example embodiments, the discharge performance of the ionizer may be automatically monitored.

Further, the discharge performance of the ionizer may be detected in the equipment with the ionizer so that the checked discharge performance of the ionizer may have improved reliability.

Furthermore, when a process may not be performed on an object in the equipment, the performance of the ionizer may be detected in real time. Thus, the performance of the ionizer may be maintained in good state. As a result, problems caused by a static electricity in the equipment may be prevented.

Moreover, the monitoring apparatus may have a small size by changing a combination and designs in elements of the monitoring apparatus. Therefore, the monitoring apparatus may be installed in the equipment.

BRIEF DESCRIPTION OF THE DRAWINGS

The above and other aspects, features and advantages of the subject matter of the present disclosure will be more clearly understood from the following detailed description taken in conjunction with the accompanying drawings, in which.

DETAILED DESCRIPTION

Various embodiments of the present invention will be described in greater detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present invention as defined in the appended claims.

The present invention is described herein with reference to cross-section and/or plan illustrations of idealized embodiments of the present invention. However, embodiments of the present invention should not be construed as limiting the disclosure. Although a few embodiments of the present invention will be shown and described, it will be appreciated by those of ordinary skill in the art that changes may be made in these embodiments without departing from the principles and spirit of the present invention.

Figure 1:
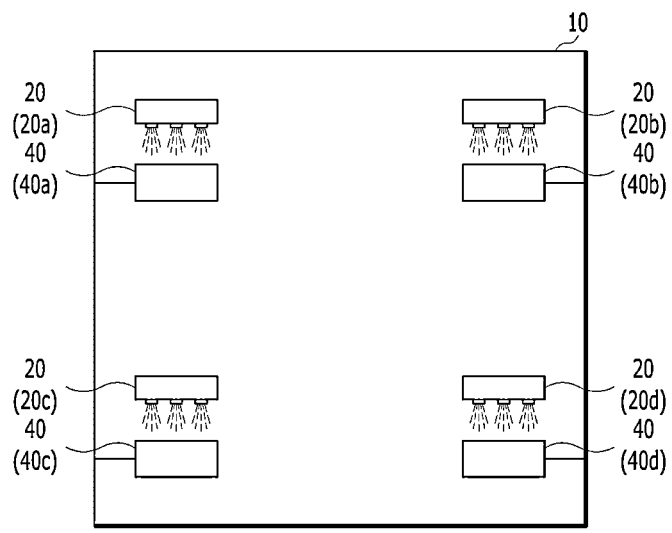
FIG. 1 is a view illustrating a monitoring apparatus of an ionizer in accordance with example embodiments.

FIG. 1 is a view illustrating a monitoring apparatus of an ionizer in accordance with example embodiments. In FIG. 1, the various elements of the monitoring apparatus may be integrated.

Referring to FIG. 1, a monitoring apparatus 40 of an ionizer 20 may be installed in equipment 10. In an embodiment, the monitoring apparatus 40 may include a plurality of monitoring apparatuses 40a, 40b, 40c and 40d. In an embodiment, the ionizer 20 may include a plurality of ionizers 20a, 20b, 20c and 20d. respectively. The plurality of monitoring apparatuses 40a, 40b, 40c and 40d may be installed in the plurality of ionizers 20a, 20b, 20c and 20c, respectively. The ionizer 20 may be any suitable apparatus including a discharge apparatus.

The monitoring apparatus 40a may be positioned adjacent to the ionizer 20a to detect voltage values and the times at which they are transmitted caused by ions generated from the ionizer 20a.

Individual identification information may be provided to the ionizer 20 and the monitoring apparatus 40. The individual identification information of the ionizer 20 and the monitoring apparatus 40 may be consulted for managing a discharge performance of the ionizer 20 or for controlling operations of the ionizer 20.

Figure 2:
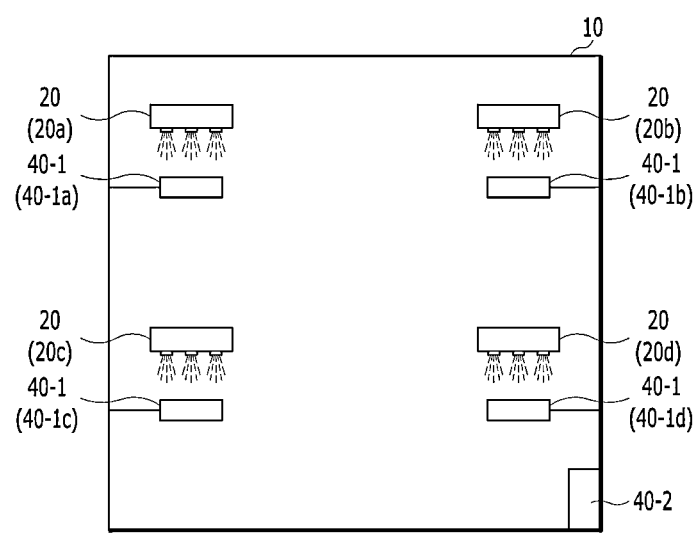
FIG. 2 is a view illustrating a monitoring apparatus of an ionizer in accordance with example embodiments.
Figure 3:
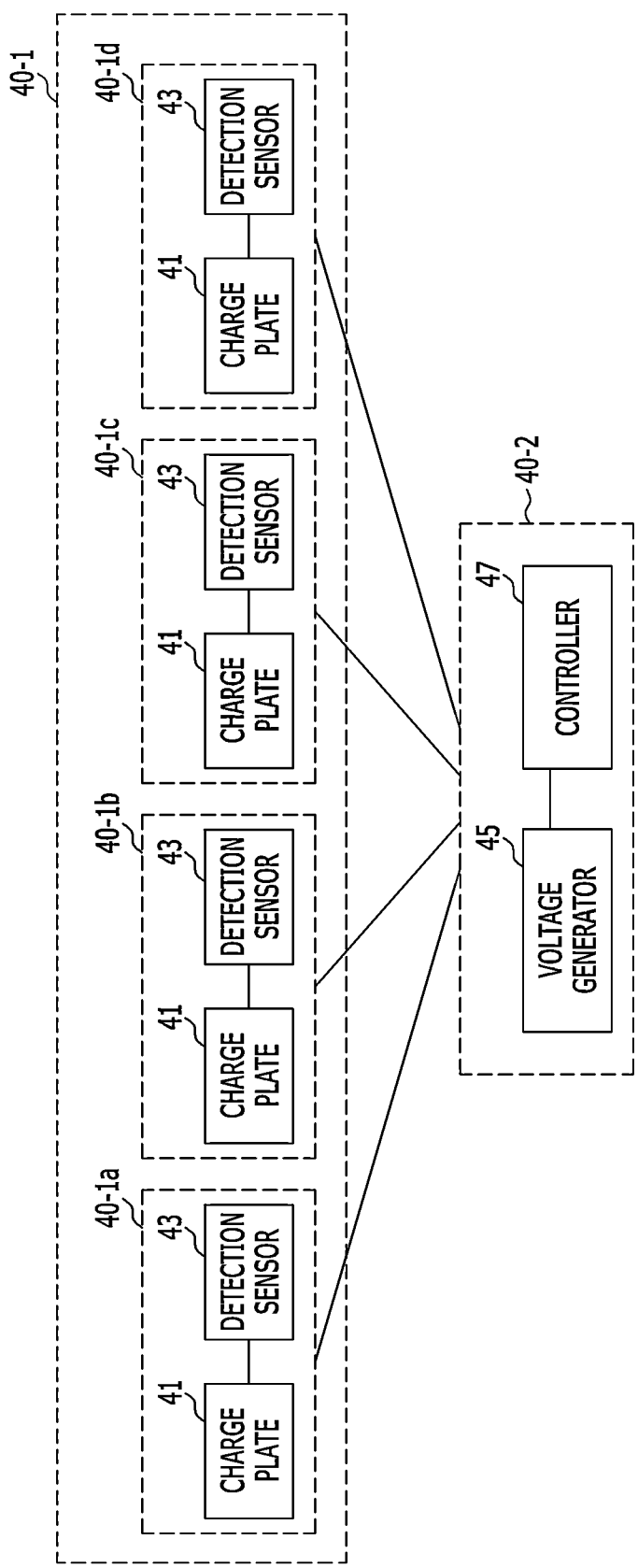
FIG. 3 is an enlarged view illustrating the monitoring apparatus in FIG. 2.

FIG. 2 is a view illustrating a monitoring apparatus of an ionizer in accordance with example embodiments, and FIG. 3 is an enlarged view illustrating the monitoring apparatus in FIG. 2.

Referring to FIG. 2 and FIG. 3, the monitoring apparatus may include a first body 40-1 and a second body 40-2 spaced apart from each other. The first body 40-1 may include a charge plate 41 and a detection sensor 43 integrally formed with each other. The second body 40-2 may include a voltage generator 45 and a controller 47 integrally formed with each other.

The monitoring apparatus 40 of the ionizer may be installed in the equipment 10. The monitoring apparatus 40 may include first bodies 40-1a, 40-1b, 40-1c and 40-1d corresponding to the ionizers 20a, 20b, 20c and 20d, respectively.

The first body 40-1a may be positioned adjacent to the ionizer 20a to detect voltage values and their transmission time caused by ions generated from the ionizer 20a.

Referring to FIG. 3, the first bodies 40-1a, 40-1b, 40-1c and 40-1d may be connected to one second body 40-2. For example, a plurality of the detection sensors 43 corresponding to the plurality of the first bodies 40-1a, 40-1b, 40-1c and 40-1d may be connected to a controller 47 of the second body 40-2. When the plurality of the controllers 47 are provided in accordance with a size and a shape of the equipment 10, the controllers 47 may have four, eight, sixteen, thirty-two channels, etc. When the equipment 10 have a large size, a plurality of the second bodies 40-2 may be provided so that the first bodies 40-1a, 40-1b, 40-1c and 40-1d may be connected to each of the second bodies 40-2 to provide the controllers 47 with four, eight, sixteen, thirty-two channels, etc. Positions of the first body 40-1 and the second body 40-2 in the equipment 10 may vary to accurately detect the discharge performance of the ionizer 20.

The monitoring apparatus in the equipment having the above-mentioned structure may have an area smaller than that of the monitoring apparatus in FIG. 1.

As mentioned above, the monitoring apparatus 40 may not include a display configured to display the performance of the ionizer 20. That is, the monitoring apparatus 40 may include only the charge plate 41, the detection sensor 43, the voltage generator 45 and the controller 47 except for the display so that the monitoring apparatus 40 may have a small size.

FIGS. 1 and 2 show example arrangements of the ionizer 20 and the monitoring apparatus 40. Thus, it should be understood that the arrangements of the ionizer 20 and the monitoring apparatus 40 may be changed by the user.

Figure 4:
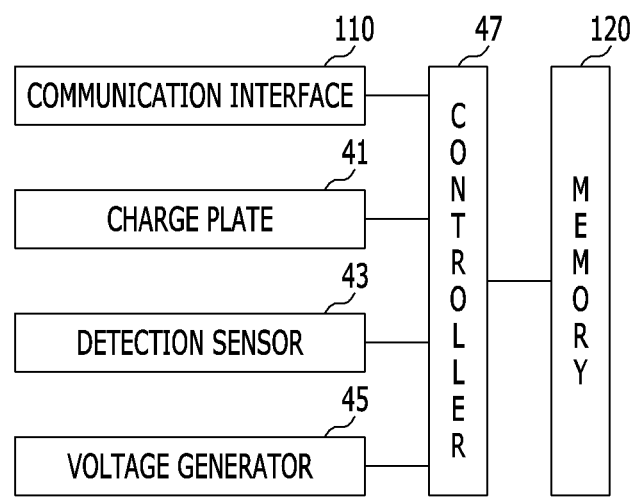
FIG. 4 is a control block diagram illustrating a monitoring apparatus of an ionizer in accordance with example embodiments.

FIG. 4 is a control block diagram illustrating a monitoring apparatus 100 of an ionizer in accordance with example embodiments.

Hereinafter, example shapes of the monitoring apparatuses of the ionizer in accordance with example embodiments may be illustrated with reference to FIGS. 5 to 13.

Referring to FIG. 4, the monitoring apparatus 100 may include a communication interface 110, a charge plate 41, a detection sensor 43, a voltage generator 45, a memory 120 and a controller 47.

The communication interface 110 may communicate with an external device via a wire, or may communicate wirelessly so as to transmit and receive information.

Figure 14:
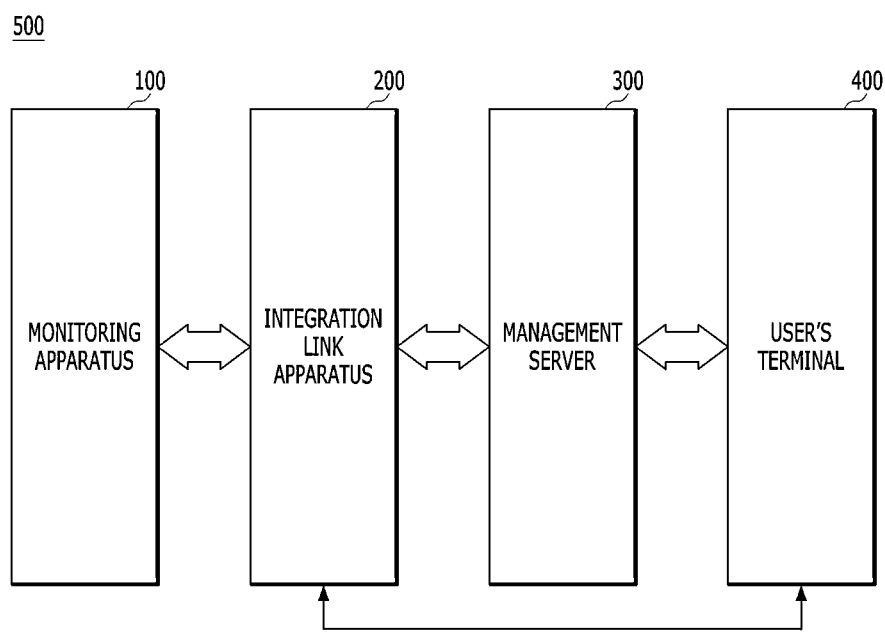
FIGS. 14 and 15 are diagrams illustrating a monitoring apparatus of an ionizer in accordance with example embodiments.

The external device may include an integration link apparatus 200 shown in FIG. 14, not restricted within a specific device. The external device may include communicable devices.

The communication interface 110 may be independently installed at each of the bodies grouped by embodying the elements of the monitoring apparatus 100 to perform communication connections between the various elements of the monitoring apparatus 100.

The charge plate 41 may be installed in the equipment with at least one ionizer 20. The charge plate 41 may be formed to correspond to the ionizer 20.

Although not depicted in drawings, the charge plate 41 of example embodiments may include a conductor, a grounded surface, an insulator and a ground. The grounded surface may be arranged opposite to the conductor. The insulator may be interposed between the conductor and the grounded surface. The ground may be connected to the grounded surface.

The detection sensor 43 may be positioned adjacent to the charge plate 41 to detect a voltage of the charge plate 41.

The detection sensor 43 may have an electrostatic field meter type configured to measure a voltage difference in a non-contact state with respect to the charge plate 41, not restricted within a specific type. Because it is not required to hold the monitoring apparatus 100 by the user's hand for detecting the discharge performance of the ionizer 20, a charged voltage may not be lost due to a contact between the charge plate 41 and the user's hand to accurately detect the discharge performance of the ionizer 20.

The charge plate 41 and the detection sensor 43 may be arranged corresponding to the at least one ionizer 20a, 20b, 20c and 20d in FIGS. 1 and 2, respectively. That is, numbers of the ionizer 20 may be substantially the same as numbers of the charge plate 41 and the detection sensor 43.

The voltage generator 45 may be configured to apply a voltage to the charge plate 41 by the controller 47.

The memory 120 may be configured to store information related to the monitoring apparatus 100. The information may include the voltage values and their transmission times, the discharge performance of the ionizer 20, a process mode of the equipment 10, etc.

For example, the process mode of the equipment 10 may include an idle mode in which an object may not be loaded into the equipment and a working mode in which the object may be loaded into the equipment 10.

The controller 47 may be configured to control the voltage applied to the charge plate 41 from the voltage generator 45. The controller 47 may be configured to receive and store the voltage values and their respective transmission times transmitted from the detection sensor 43 in generating the ions from the ionizer 20 during a monitoring time. The controller 47 may be configured to check the discharge performance of the ionizer 20 based on the received voltage values and their respective transmission times.

The controller 47 may be configured to detect a time from a point when the voltage may be applied to the charge plate 41 to a point when a measured voltage value may be decreased to a reference voltage based on the voltage values and their respective transmission times to check the discharge performance of the ionizer 20.

The time from the point when the voltage may be applied to the charge plate 41 to the point when the measured voltage value may be decreased to the reference voltage may be a decay time in which a voltage value of a corresponding region may be decreased to the reference voltage by the ions generated from the ionizer 20. That is, the discharge performance may be the decay time. For example, when a voltage of about ±1,000V may be applied to the charge plate 41, the decay time may be a time in which the applied voltage may be attenuated by about 90%. Here, when the applied voltage to the charge plate 41 may be about ±1,000V, the reference voltage may be about ±100V. Further, when the applied voltage to the charge plate 41 may be about ±2,000V, the reference voltage may be about ±200V.

The controller 47 may be configured to monitor the performance of the ionizer 20 in accordance with a predetermined monitoring schedule or a request of the user. The controller 47 may be configured to check whether the process mode may be the idle mode or not. When the process mode is the idle mode, the controller 47 may monitor the ionizer 20. For example, the controller 47 may generate a monitoring command in accordance with the monitoring schedule by a second, a minute, a time, a month, etc., set by the user, or in accordance with an immediate request of the user.

Therefore, the memory 120 may receive information including the loading of the object into the equipment from the external device such as a management server 300 for the ionizer. The memory 120 may store the process mode classified into the idle mode and the working mode based on the received information.

Hereinafter, internal structures of the monitoring apparatus 100 may be illustrated with reference to FIGS. 5 to 13.

Figure 5:
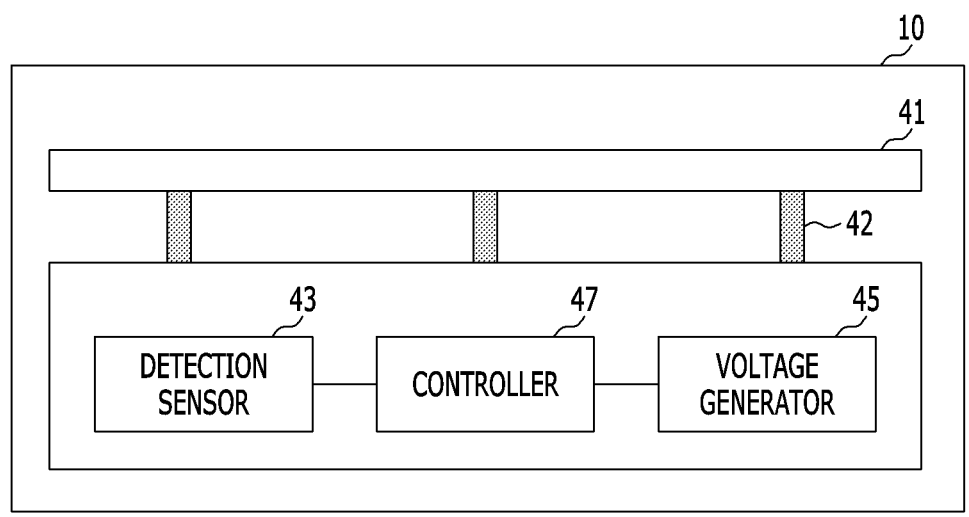
FIGS. 5 to 13 are diagrams illustrating shapes of monitoring apparatuses of an ionizer in accordance with example embodiments.
Figure 6:
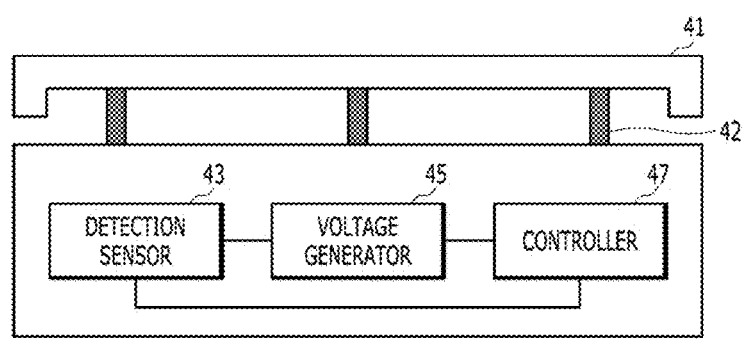

Referring to FIGS. 5 and 6, when the charge plate 41, the detection sensor 43, the voltage generator 45 and the controller 47 are integrally formed with each other, the monitoring apparatus 100 may further include an insulation post 42 connected between the charge plate 41 and the detection sensor 43, the voltage generator 45, and the controller 47. The insulation post 42 may shield the detection sensor 43, the voltage generator 45 and the controller 47 from the voltage applied to the charge plate 41. The insulation post 42 may be made of or include an insulation material. The various insulation posts 42 illustrated later may correspond to the insulation post 42 of FIG. 5.

The charge plate 41, the detection sensor 43, the voltage generator 45, the controller 47 and the insulation post 42 may be positioned in the equipment 10.

For example, the charge plate 41 may have a flat plate shape as shown in FIG. 5. Alternatively, the charge plate 41 may include an extension vertically extended from the flat plate and an edge portion of the plat plate as shown in FIG. 6.

In FIG. 6, the charge plate 41 may have a downwardly bent shape. Thus, the charge plate 41 may occupy an area in the equipment 10. However, an actual area of the charge plate 41 may further include the bent portion. Thus, the charge plate 41 may have a larger area configured to receive the high voltage for detecting the discharge performance of the ionizer 20 than the area of the charge plate 41 shown in FIG. 5. Further, the charge plate 41 may have a small size received in the equipment 10.

Referring to FIGS. 7 to 13, the charge plate 41 and the detection sensor 43 may integrally form the first body 40-1 of FIG. 3. The voltage generator 45 and the controller 47 may integrally form the second body 40-2 of FIG. 3. Further, when the first body 40-1 and the second body 40-2 are spaced apart from each other, each of the first body 40-1 and the second body 40-2 may include the communication interface 110 having the wire or the wireless communication structure. At this time, the time at which the wireless communication mode is switched to the wire communication mode may be arbitrarily set by the operator.

When wireless communication mode is used between the first body 40-1 and the second body 40-2, the voltage values and their respective transmission times may not be transmitted from the detection sensor 43 in a reference time. In this case, the controller 47 may convert the wireless communication mode into the wire communication mode.

In contrast, when the wire communication mode is used between the first body 40-1 and the second body 40-2, the voltage values and their respective transmission times may be continuously transmitted from the detection sensor 43 in a reference time. In this case, the controller 47 may convert the wire communication mode into the wireless communication mode.

As shown in FIG. 3, the first body 40-1 may include a plurality of first bodies 40-1a, 40-1b, 40-1c and 40-1d. Each of the first bodies may include the charge plate 41 and the detection sensor 43. The second body 40-2 may be connected to each of the first bodies 40-1a, 40-1b, 40-1c and 40-1d of the first body 40-1.

That is, one second body 40-2 in the equipment 10 may be connected to the first bodies 40-1a, 40-1b, 40-1c, and 40-1d to perform the monitoring controls. Thus, an occupying area of the second body 40-2 in the equipment 10 may be decreased.

This structure may be advantageous because it may decrease the size of the monitoring apparatus 100 and may maintain the good reliability of the discharge performance detection of the ionizer 20.

The controller 47 may transmit the monitoring command to the charge plates 41 and the detection sensor 43 of the first body 40-1 in accordance with the monitoring schedule. The controller 47 may apply the voltage to the charge plate 41 through the voltage generator 45. The controller 47 may transmit a voltage detection command to the detection sensor 43.

For example, the controller 47 may sequentially transmit the monitoring command to the first bodies 40-1a, 40-1b, 40-1c and 40-1d of the first body 40-1. Because the charge plate 41 and the detection sensor 43 of the first body 40-1 may be individually driven, the performances of the ionizer 20a, 20b and 20c corresponding to the first bodies 40-1a, 40-1b, 40-1c and 40-1d may be more accurately detected.

In example embodiments, the first body 40-1 and the second body 40-2 may be arranged to be spaced apart from each other in the equipment 10. Driving timings of the first bodies 40-1a, 40-1b, 40-1c and 40-1d of the first body 40-1 may be sequentially or randomly controlled.

Figure 7:
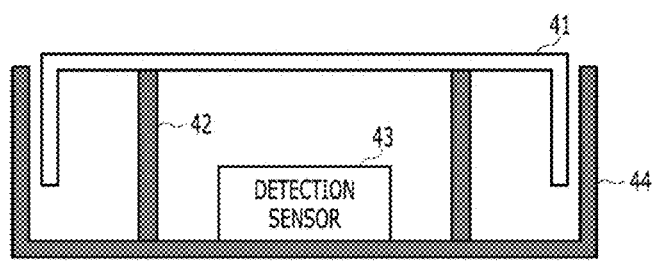

Referring to FIG. 7, when the charge plate 41 has a "[" shape, the monitoring apparatus 100 may further include an insulation case 44 and a plurality of insulation posts 42. The insulation case 44 may have a "[" shape configured to expose an upper surface of the charge plate 41 and to cover a side surface and a lower surface of the charge plate 41. The insulation posts 42 may be connected between an upper portion of an inner surface of the charge plate 41 and a bottom surface of the insulation case 44. The detection sensor 43 may be positioned in a space between the charge plate 41 and the insulation case 44.

Figure 8:
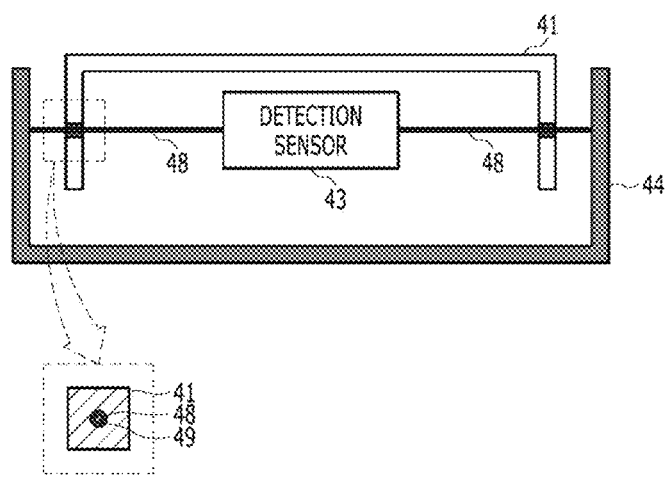

Referring to FIG. 8, when the charge plate 41 has a "[" shape, the monitoring apparatus 100 may further include an insulation case 44 and a fixing member 48. The insulation case 44 may have a "[" shape configured to expose an upper surface of the charge plate 41 and to cover a side surface and a lower surface of the charge plate 41. The fixing member 48 may be connected between both surfaces of the detection sensor 43 and an inner wall of the insulation case 44 via a hole, which may be formed through the side surface of the charge plate 41, to maintain a floating state of the detection sensor 43 in the charge plate 41. The fixing member 48 may include a communication wire connected between the detection sensor 43 and the controller 47.

An insulator 49 may be interposed between a contact area between the charge plate 41 and the fixing member 48, i.e., between the charge plate 41 and the fixing member 48 to shield a voltage interference between the charge plate 41 and the fixing member 48.

Particularly, the charge plate 41 in FIGS. 7 and 8 may have the "[" shape including the flat plate and the extensions vertically extended from the edge portion of the flat plate in a downward direction.

Figure 9:
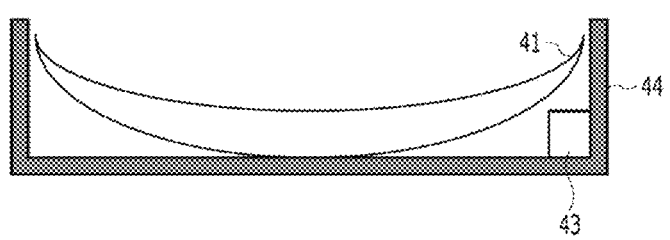
Figure 10:
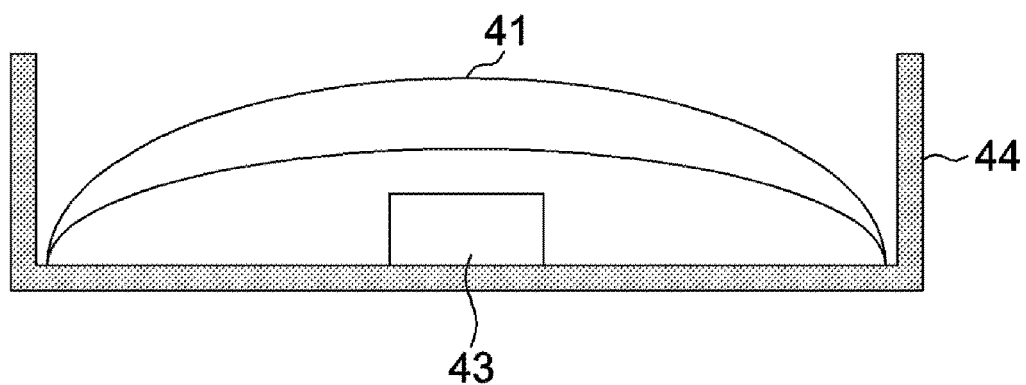

Referring to FIGS. 9 and 10, when the charge plate 41 has a concave upper surface as shown in FIG. 9 or a convex lower surface as shown in FIG. 10, the monitoring apparatus 100 may further include an insulation case 44. The insulation case 44 may have a "[" shape configured to expose an upper surface of the charge plate 41 and to cover a side surface and a lower surface of the charge plate 41. The detection sensor 43 may be positioned in a space between the charge plate 41 and the insulation case 44.

Figure 11:
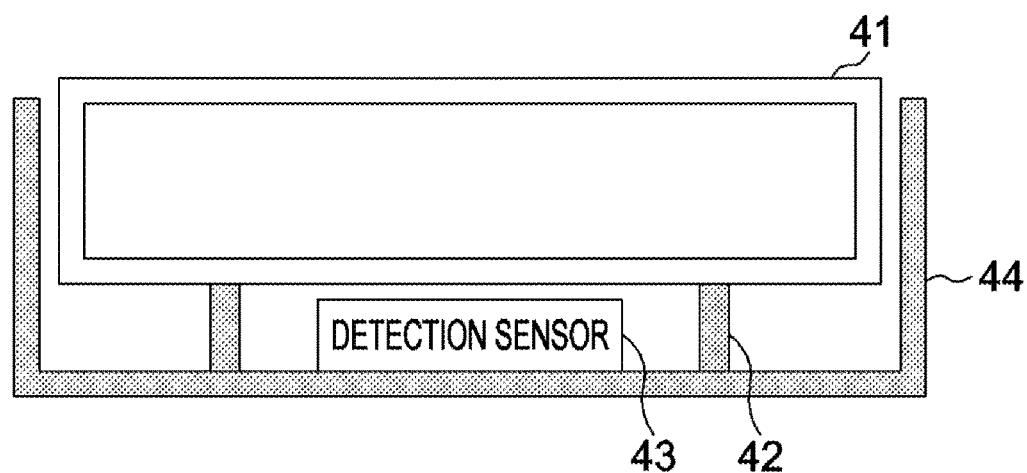

Referring to FIG. 11, when the charge plate 41 has a hollow hexahedral shape, the monitoring apparatus 100 may further include an insulation case 44 and a plurality of posts 42. The insulation case 44 may have a "[" shape configured to expose an upper surface of the charge plate 41 and to cover a side surface and a lower surface of the charge plate 41. The posts 42 may be connected between the charge plate 41 and the insulation case 44. The detection sensor 43 may be positioned in a space between the charge plate 41 and the insulation case 44.

Figure 12:
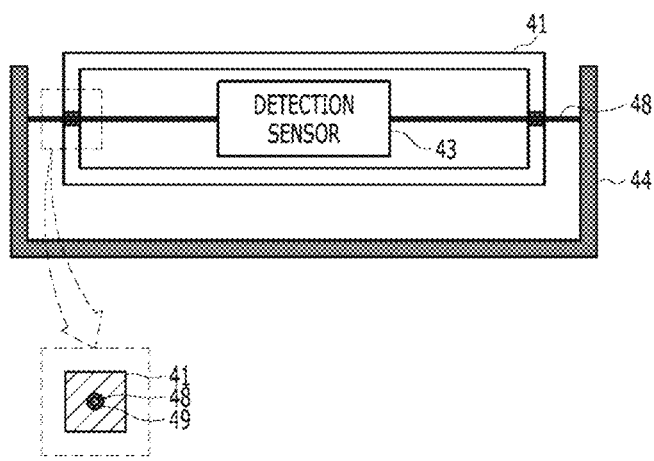

Referring to FIG. 12, the charge plate 41 may have a hollow hexahedral shape, and the monitoring apparatus 100 may further include an insulation case 44 and a fixing member 48. The insulation case 44 may have a "[" shape configured to expose an upper surface of the charge plate 41 and to cover a side surface and a lower surface of the charge plate 41. The fixing member 48 may be connected between both surfaces of the detection sensor 43 and an inner wall of the insulation case 44 via a hole, which may be formed through the side surface of the charge plate 41, to maintain a floating state of the detection sensor 43 in the charge plate 41.

An insulator 49 may be interposed between a contact area between the charge plate 41 and the fixing member 48, i.e., between the charge plate 41 and the fixing member 48 to shield a voltage interference between the charge plate 41 and the fixing member 48.

Figure 13:
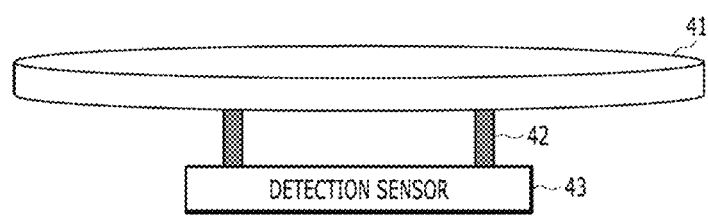

Referring to FIG. 13, the charge plate 41 may have a cylindrical shape, and the monitoring apparatus 100 may further include an insulation post 42 configured to connect the charge plate 41 with the detection sensor 43.

Figure 15:
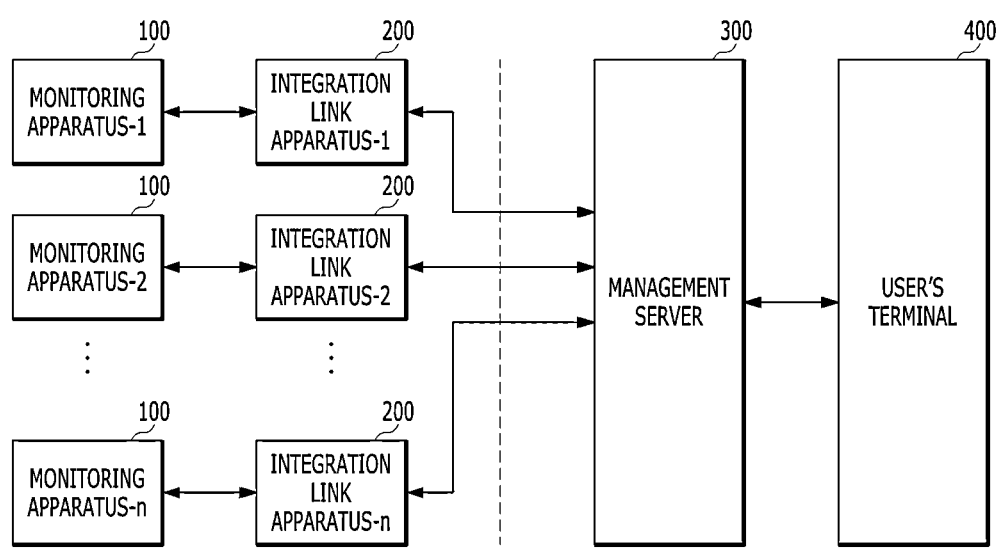

FIGS. 14 and 15 are views illustrating a monitoring apparatus of an ionizer in accordance with example embodiments.

Figure 16:
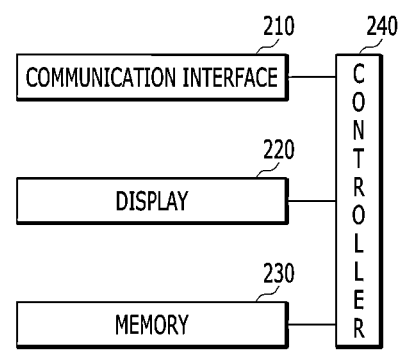
FIG. 16 is a view illustrating an integration link apparatus in accordance with example embodiments.
Figure 17:
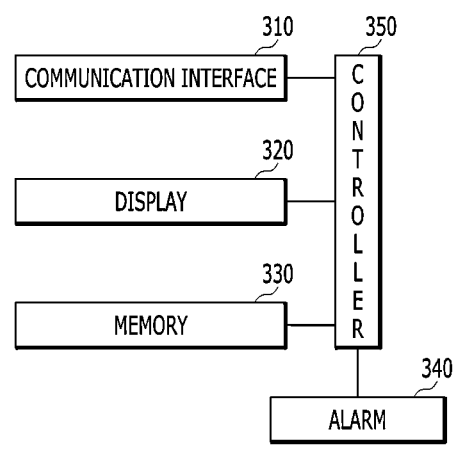
FIG. 17 is a view illustrating a management server of an ionizer in accordance with example embodiments.

Hereinafter, the monitoring apparatus 100 may be illustrated with reference to FIG. 16 illustrating an integration link apparatus 200 in accordance with example embodiments and FIG. 17 illustrating a management server of an ionizer in accordance with example embodiments.

Referring to FIG. 14, a monitoring system 500 may include a monitoring apparatus 100, an integration link apparatus 200, a management server 300 and a user's terminal 400.

Referring to FIG. 14, the monitoring apparatus 100 may be positioned in the equipment 10, which may have the wire or the wireless communication, with the ionizer 20. The monitoring apparatus 100 may detect the time until the voltage value may be decreased to the reference voltage based on the voltage values and their transmission time during the monitoring time in the equipment 10 to check the discharge performance of the ionizer 20.

Referring to FIG. 4, the monitoring apparatus 100 may include a communication interface 110, a charge plate 41, a detection sensor 43, a voltage generator 45, a memory 120 and a controller 47.

The communication interface 110 may be communicated with an external device via a wire, or may be communicated wirelessly to transmit and receive information.

The external device may include an integration link apparatus 200, not restricted within a specific device. The external device may include communicable devices.

The communication interface 110 may be independently installed at each of bodies grouped by embodying the elements of the monitoring apparatus 100 to perform communication connections between the elements of the monitoring apparatus 100.

The charge plate 41 may be installed in the equipment with at least one ionizer 20. The charge plate 41 may be formed corresponding to the ionizer 20.

Although not depicted in the drawings, the charge plate 41 of the example embodiments may include a conductor, a grounded surface, an insulator and a ground. The grounded surface may be arranged opposite to the conductor. The insulator may be interposed between the conductor and the grounded surface. The ground may be connected to the grounded surface.

The detection sensor 43 may be positioned adjacent to the charge plate 41 to detect a voltage of the charge plate 41.

The charge plate 41 and the detection sensor 43 may be arranged corresponding to the at least one ionizer 20a, 20b, 20c and 20d in FIGS. 1 and 2, respectively. That is, numbers of the ionizer 20 may be substantially the same as numbers of pair the charge plate 41 and the detection sensor 43.

The voltage generator 45 may be configured to apply a voltage to the charge plate 41 by the controller 47.

The memory 120 may be configured to store information related to the monitoring apparatus 100. The information may include the voltage values and their respective transmission times, the discharge performance of the ionizer 20, a process mode of the equipment 10, etc.

The process mode may include an idle mode in which an object may not be loaded into the equipment and a working mode in which the object may be loaded into the equipment 10.

The controller 47 may be configured to control the voltage applied to the charge plate 41 from the voltage generator 45. The controller 47 may be configured to receive and store the voltage values and their respective transmission times transmitted from the detection sensor 43 in generating the ions from the ionizer 20 during a monitoring time. The controller 47 may be configured to check the discharge performance of the ionizer 20 based on the receive voltage values and their respective transmission times.

The controller 47 may be configured to detect a time from a point when the voltage may be applied to the charge plate 41 to a point when a measured voltage value may be decreased to a reference voltage based on the voltage values and their respective transmission times to check the discharge performance of the ionizer 20.

Referring to FIGS. 5 and 6, when the charge plate 41, the detection sensor 43, the voltage generator 45 and the controller 47 are integrally formed with each other, the monitoring apparatus 100 may further include an insulation post 42 connected between the charge plate 41, the detection sensor 43, the voltage generator 45 and the controller 47.

The charge plate 41, the detection sensor 43, the voltage generator 45, the controller 47 and the insulation post 42 may be positioned in the equipment 10.

Referring to FIGS. 7 to 13, the charge plate 41 and the detection sensor 43 may integrally form the first body 40-1 in FIG. 3. The voltage generator 45 and the controller 47 may integrally form the second body 40-2 in FIG. 3. Further, when the first body 40-1 and the second body 40-2 are spaced apart from each other, each of the first body 40-1 and the second body 40-2 may include the communication interface 110 having the wire or the wireless communication structure.

When the wireless communication mode may be formed between the first body 40-1 and the second body 40-2, the voltage values and their respective transmission times may not be transmitted from the detection sensor 43 in a reference time. In this case, the controller 47 may convert the wireless communication mode into the wire communication mode.

In contrast, when the wire communication mode may be formed between the first body 40-1 and the second body 40-2, the voltage values and their respective transmission times may be continuously transmitted from the detection sensor 43 in a reference time. In this case, the controller 47 may convert the wire communication mode into the wireless communication mode.

As shown in FIG. 3, the first body 40-1 may include a plurality of first bodies 40-1a, 40-1b, 40-1c and 40-1d. Each of the first bodies may include the charge plate 41 and the detection sensor 43. The second body 40-2 may be connected to the first bodies 40-1a, 40-1b, 40-1c and 40-1d of the first body 40-1.

That is, one second body 40-2 in the equipment 10 may be connected to the first bodies 40-1a, 40-1b, 40-c, and 40-1d to perform the monitoring controls. Thus, an occupying area of the second body 40-2 in the equipment 10 may be decreased.

This structure may be advantageous because it may decrease the size of the monitoring apparatus 100 and in maintain good reliability of the discharge performance detection of the ionizer 20.

The controller 47 may transmit the monitoring command to the charge plates 41 and the detection sensor 43 of the first body 40-1 in accordance with the monitoring schedule. The controller 47 may apply the voltage to the charge plate 41 through the voltage generator 45. The controller 47 may transmit a voltage detection command to the detection sensor 43.

For example, the controller 47 may sequentially transmit the monitoring command to the first bodies 40-1a, 40-1b, 40-1c and 40-1d of the first body 40-1. Because the charge plate 41 and the detection sensor 43 of the first body 40-1 may be individually driven, the performances of the ionizer 20a, 20b and 20c corresponding to the pairs 40-1a, 40-1b, 40-1c and 40-1d may be more accurately detected.

The integration link apparatus 200 may have a wire or a wireless communication structure. The integration link apparatus 200 may cover the discharge performance type and the communication protocol of the ionizer 20 transmitted from the monitoring apparatus 100 into the reference type and the reference communication protocol.

Referring to FIG. 15, the integration link apparatus 200 may be provided to the monitoring apparatus 100 in one-to-one relation to receive the voltage values and their transmission time of the ionizer 20 transmitted from one monitoring apparatus 100.

The voltage values and their respective transmission times of the ionizer may be matched with at least one of identification information of the equipment with the ionizer 20, identification information of the ionizer 20, identification information of the monitoring apparatus 100, identification information of the detection sensor in the monitoring apparatus and identification information of a factor in which the equipment 10 may be installed. The voltage values and their respective transmission times may then be transmitted or stored.

Referring to FIG. 16, the integration link apparatus 200 may include a communication interface 210, a display 220, a memory 230 and a controller 240.

The communication interface 210 may have wire or the wireless communication with the external device for transmitting information.

The display 220 may be configured to display information including the discharge performance of the ionizer 20 stored in the memory 230 in accordance with the request of the user.

The display 220 may output the voltage values and their respective transmission times of the ionizer, the discharge performance of the ionizer calculated based on the voltage values and their respective transmission times, etc., on a monitor by the controller 240 in accordance with the request of the user.

The memory 230 may be configured to store information of the integration link apparatus 200 including the discharge performance of the ionizer 20. The memory 230 may store the discharge performance of the ionizer 20 in monitoring record information by the ionizers 20.

The controller 240 may cover the analog discharge performance of the ionizer 20 transmitted from the monitoring apparatus 100 into digital data. The controller 240 may convert the communication protocol of the discharge performance of the ionizer 20 into the reference communication protocol. The controller 240 may then transmit the converted communication protocol to the management server 300 through the wire or the wireless communication.

The management server 300 may have the wire or the wireless communication. The management server 300 may be configured to compare the discharge performance of the ionizer 20 transmitted from the integration link apparatus 200 with a reference value. The management server 300 may store analysis information including abnormality of the ionizer 20. The management server 300 may control operations of the ionizer 20 in accordance with the analysis information.

Referring to FIG. 17, the management server 300 may include a communication interface 310, a display 320, a memory 330, an alarm 340 and a controller 350.

The communication interface 310 may have wire or wireless communication with the external device for transmitting information.

The display 320 may be configured to display information including the discharge performance of the ionizer 20 stored in the memory 330 in accordance with the request of the user.

The memory 330 may be configured to store information of the management server 300 including a reference value used for checking whether the ionizer 20 may be normal or not, the discharge performance of the ionizer 20 transmitted from the integration link apparatus 200, etc.

When the discharge performance of the ionizer 20 is above a reference value, the alarm 340 may transmit an alarm message or a mail of the ionizer 20 to the user's terminal or output the abnormal alarm including at least one a text, a sound, an image and a light.

The controller 350 may compare the discharge performance of the ionizer 20 transmitted from the integration link apparatus 200 with the reference value. The controller 350 may transmit operational control information to the ionizer 20 based on comparison results.

The controller 350 may generate the operational control information including at least one of stopping of the ionizer 20 and adjusting of ion amounts from the ionizer 20.

The controller 350 may accumulate and manage the discharge performances of the ionizer 20 by transmission time from the integration link apparatus 200. The controller 350 may process the discharge performances of the ionizer 20 in various manners to check the discharge performances of the ionizer 20 using a graph. The discharge performances of the ionizer 20 may be matched with the identification information of the ionizers 20, respectively.

Further, the processed discharge performances of the ionizer may include information related to a record when the discharge performance of the ionizer may be above the reference value.

The controller 350 may transmit the discharge performance of the ionizer 20 transmitted from the integration link apparatus 200 in real time to the user's terminal or the integration link apparatus 200 to check the discharge performance of the ionizer 20 by the user.

The controller 350 may provide the integration link apparatus 200 or the user's terminal with the processed discharge performance of the ionizer.

The user's terminal may store the analysis information including the abnormality of the ionizer 20 transmitted from the integration link apparatus 200 or the management server 300 through the wire or the wireless communication. The user's terminal may output the analysis information through a monitor in accordance with the request of the user. The user's terminal may transmit the operational control information of the ionizer 20 in accordance with the request of the user.

The above described embodiments of the present invention are intended to illustrate and not to limit the present invention. Various alternatives and equivalents are possible. The invention is not limited by the embodiments described herein. Nor is the invention limited to any specific type of semiconductor device. Another additions, subtractions, or modifications are obvious in view of the present disclosure and are intended to fall within the scope of the appended claims.

What is claimed is:

1. A monitoring apparatus of an ionizer comprising:
   a charge plate arranged in an equipment with at least one ionizer, the charge plate formed to correspond to the ionizer;
   a detection sensor arranged adjacent to the charge plate to detect a voltage of the charge plate;
   a voltage generator configured to apply the voltage to the charge plate;
   a controller configured to control the voltage applied to the charge plate through the voltage generator, to receive and store voltage values and their transmission time which are transmitted from the detection sensor in generating ions from the ionizer during a monitoring time, and to check a discharge performance of the ionizer based on the voltage values and their respective transmission times; and
   an insulation case having a shape configured to expose an upper surface of the charge plate and cover a side surface and a lower surface of the charge plate,
   wherein the charge plate and the detection sensor are formed to correspond to the at least one ionizer, and
   wherein the charge plate is selected from one of a charge plate having a flat plate with an extension part extending vertically from an edge portion of the flat plate, a charge plate having a concave upper surface and a charge plate having a convex lower surface.

2. The monitoring apparatus of the ionizer of claim 1, further comprising:
   a communication interface configured to transmit information to an external device in a wire or a wireless communication; and
   a memory configured to store information related to the monitoring apparatus including the voltage values and their respective transmission times, the discharge performance of the ionizer and a process mode of the equipment.

3. The monitoring apparatus of the ionizer of claim 2, wherein the controller detects a time from a point when the voltage is applied to the charge plate to a point when a measured voltage value is decreased to a reference voltage based on the voltage values and their respective transmission times to check the discharge performance of the ionizer.

4. The monitoring apparatus of the ionizer of claim 3, wherein the controller controls a performance of the ionizer by a predetermined monitoring schedule or a request of a user, the controller identifies whether the process mode is an idle mode or not, and the controller begins monitoring operations of the ionizer when the process mode is the idle mode.

5. The monitoring apparatus of the ionizer of claim 4,
wherein the charge plate, the detection sensor, the voltage generator and the controller are integrally formed with each other,
wherein the monitoring apparatus further comprises a plurality of insulation posts connected between the charge plate, the detection sensor, the voltage generator and the controller, and the charge plate, the detection sensor, the voltage generator, the controller, and the insulation posts are positioned in the equipment.

6. The monitoring apparatus of the ionizer of claim 4,
wherein the charge plate and the detection sensor are integrally formed with each other to form a first body,
wherein the voltage generator and the controller are integrally formed with each other to form a second body,
wherein the first body and the second body are spaced apart from each other,
wherein each of the first body and the second body comprises a communication interface having a wire communication mode or a wireless communication mode, and
wherein the controller converts the wireless communication mode into the wire communication mode when the wireless communication mode is formed between the first body and the second body and the voltage values are not transmitted from the detection sensor in a reference time.

7. The monitoring apparatus of the ionizer of claim 6, wherein the first body comprises a plurality of first bodies, each including the charge plate and the detection sensor, respectively,
wherein the second body is connected to the plurality of the first bodies each including the charge plate and the detection sensor,
wherein the controller transmits a monitoring command to each of the charge plate and the detection sensor of the first bodies,
wherein the controller applies a voltage to the charge plate through the voltage generator, and transmits a voltage detection command to the detection sensor.

8. The monitoring apparatus of the ionizer of claim 6, wherein the charge plate has the flat plate and the extension part extending vertically from the edge portion of the flat plate and the insulation case has the shape configured to expose the upper surface of the charge plate and cover the side surface and the lower surface of the charge plate,
the monitoring apparatus further comprises a plurality of insulation posts connected between an upper portion of an inner surface of the charge plate and a bottom surface of the insulation case, and the detection sensor is arranged between the charge plate and the insulation case.

9. The monitoring apparatus of the ionizer of claim 6, wherein the charge plate has the flat plate and the extension part extending vertically from the edge portion of the flat plate and the insulation case has the shape configured to expose the upper surface of the charge plate and cover the side surface and the lower surface of the charge plate, the monitoring apparatus further comprises a fixing member connected between both surfaces of the detection sensor and an inner wall of the insulation case via a hole formed through a side surface of the charge plate to maintain a floating state of the detection sensor in the charge plate.

10. The monitoring apparatus of the ionizer of claim 6, wherein the charge plate has the concave upper surface or the convex lower surface and the insulation case has the shape configured to expose the upper surface of the charge plate and cover the side surface and the lower surface of the charge plate, and the monitoring apparatus further comprises the detection sensor is arranged between the charge plate and the insulation case.

11. The monitoring apparatus of the ionizer of claim 6, wherein the charge plate has a cylindrical shape, the monitoring apparatus further comprises an insulation post connected between the charge plate and the detection sensor.

12. A monitoring system comprising:
a monitoring apparatus positioned in an equipment including at least one ionizer to detect a time until a voltage value is decreased to a reference voltage based on voltage values detected during monitoring the equipment, thereby checking a discharge performance of the ionizer;
an integration link apparatus configured to convert a type of the discharge performance and a communication protocol of the ionizer transmitted from the monitoring apparatus into a reference type and a reference communication protocol; and
a management server configured to compare the discharge performance of the ionizer transmitted from the integration link apparatus with a reference value to store analysis information including abnormal state of the ionizer and to control operations of the ionizer in accordance with the analysis information,
wherein the monitoring apparatus comprises:
a charge plate arranged in an equipment with at least one ionizer, the charge plate formed to correspond to the ionizer;
a detection sensor arranged adjacent to the charge plate to detect a voltage of the charge plate;
a voltage generator configured to apply the voltage to the charge plate;
a controller configured to control the voltage applied to the charge plate through the voltage generator, to receive and store voltage values and their transmission time which are transmitted from the detection sensor in generating ions from the ionizer during a monitoring time, and to check a discharge performance of the ionizer based on the voltage values and their respective transmission times; and
an insulation case having a shape configured to expose an upper surface of the charge plate and cover a side surface and a lower surface of the charge plate,
wherein the charge plate and the detection sensor are formed to correspond to the at least one ionizer, and
wherein the charge plate is selected from one of a charge plate having a flat plate with an extension part extending vertically from an edge portion of the flat plate, a charge plate having a concave upper surface and a charge plate having a convex lower surface.

13. The monitoring system of claim 12, wherein the monitoring apparatus comprises:
a wire or wireless communication interface configured to transmit information to an external device; and a memory configured to store information related to the monitoring apparatus including the voltage values and their respective transmission times, the discharge performance of the ionizer and a process mode of the equipment, wherein the controller detects a time from a point when the voltage is applied to the charge plate to a point when a measured voltage value is decreased to a reference voltage based on the voltage values and their respective transmission times to check the discharge performance of the ionizer.

14. The monitoring system of claim 12, further comprising a user's terminal configured to store the analysis information including the abnormality of the ionizer transmitted from the integration link apparatus or the management server through the wire communication or the wireless communication, to output the analysis information through a monitor by a request of the user, and to transmit operational control information of the ionizer by the request of the user.

15. The monitoring system of claim 12, wherein the integration link apparatus comprises:

a wire or wireless communication interface configured to transmit information to an external device;

a memory configured to store information related to the integration link apparatus including the discharge performance of the ionizer in a monitoring record type by the ionizer;

a display configured to display the information in the memory including the discharge performance of the ionizer by the request of the user; and a controller configured to convert a type of data, which includes the discharge performance received from the external device, and the communication protocol of the ionizer into the reference type and the reference communication protocol, and to transmit control information of the ionizer transmitted from the management server based on related identification information to the ionizer, wherein the controller converts the discharge performance of the ionizer in analog information transmitted from the monitoring apparatus into digital information, converts a communication protocol of the discharge performance of the ionizer into a predetermined communication protocol, and transmits the converted communication protocol to the management server of the ionizer through the wire communication or the wireless communication.

16. The monitoring system of claim 12, wherein the management server comprises:

a wire or wireless communication interface configured to transmit information to an external device;

a memory configured to store information related to the management server apparatus including a reference value used for checking abnormality of the ionizer and the discharge performance of the ionizer transmitted from the integration link apparatus;

a controller configured to compare the discharge performance of the ionizer transmitted from the integration link apparatus with the reference value, and to transmit operational control information to the ionizer based on comparison results; and an alarm configured to transmit an alarm message or a mail of the ionizer to a user's terminal when the performance of the ionizer is above the reference value, or to output an abnormal alarm of the ionizer including at least one a text, a sound, an image and a light, wherein the controller generates the operational control information including at least one stopping of the ionizer and adjusting of ion amounts from the ionizer.

17. A monitoring apparatus of an ionizer comprising:

a voltage generator configured to apply first voltages to a charge plate;

a detection sensor configured to detect second voltages of the charge plate;

a controller configured to control the first voltages, to receive the detected second voltages from the detection sensor, and to determine a discharge performance of the ionizer based on the detected second voltages; and an insulation case having a shape configured to expose an upper surface of the charge plate and cover a side surface and a lower surface of the charge plate, wherein the charge plate is selected from one of a charge plate having a flat plate with an extension part extending vertically from an edge portion of the flat plate, a charge plate having a concave upper surface and a charge plate having a convex lower surface.

\* \* \* \* \*